United States Patent [19]
Lackey et al.

[11] Patent Number: 5,352,656
[45] Date of Patent: Oct. 4, 1994

[54] METHOD FOR THE CHEMICAL VAPOR DEPOSITION OF GROUP IB AND GROUP VIIIB METAL BARRIER LAYERS

[75] Inventors: Walter J. Lackey, Marietta; John A. Hanigofsky, Smyrna; David N. Hill, Chamblee, all of Ga.; Michael J. Shapiro, Fairfax, Va.; E. Kent Barefield, Decatur, Ga.; William B. Carter, Atlanta, Ga.

[73] Assignee: Georgia Tech Research Corporation, Atlanta, Ga.

[21] Appl. No.: 852,813

[22] Filed: Mar. 17, 1992

Related U.S. Application Data

[63] Continuation-in-part of Ser. No. 439,843, Nov. 21, 1989, Pat. No. 5,108,983.

[51] Int. Cl.$^5$ .......................... B05D 5/12; C23C 16/00
[52] U.S. Cl. ................................ 505/434; 505/730; 505/701; 505/702; 505/473; 427/62; 427/250; 427/125; 427/124; 427/123
[58] Field of Search .............. 427/250, 125, 124, 123, 427/62; 505/1, 730, 701, 702; 118/715, 726

[56] References Cited

U.S. PATENT DOCUMENTS

| | | | |
|---|---|---|---|
| 4,054,686 | 10/1977 | Newkirk et al. | 427/62 |
| 4,202,931 | 5/1980 | Newkirk et al. | 428/662 |
| 4,741,928 | 5/1988 | Wilson et al. | 427/250 |
| 4,880,670 | 11/1989 | Erbil | 427/226 |
| 4,975,413 | 12/1990 | Satek et al. | 505/1 |
| 5,154,862 | 10/1992 | Reagan et al. | 427/255.1 |

FOREIGN PATENT DOCUMENTS 0297348  1/1989  European Pat. Off. ..... C23C 16/18

OTHER PUBLICATIONS

Voorhoeve, R. J. H. et al., "Selective Deposition of Silver on Silicon by Reaction with Silver Fluoride Vapor", J. Electrochem. Soc., vol. 119, pp. 364–368 (Mar. 1972).
Anonymous, "Laser Chemical Vapor Deposition of Silver," Research Disclosure, vol. 363, p. 146 (Mar. 1986).
Oehr, C. et al., "Deposition of Silver Films by Plasma--Enhanced Chemical Vapour Deposition", Appl. Phys. A., vol. 59, pp. 691–696 (1989).
Mogro-Campero, A. et al., "Thickness and Annealing Dependence of the Superconducting Transition Temperature of $YBa_2Cu_3O_{7-x}$ Thin Films", Appl. Phys. Lett., vol. 53, p. 2566 (1988).
Fujino, K., "Effect of Indium-Tin Oxide Buffer Layers on Superconducting Y-Ba-Cu-O Thin Films with Glass Substrates".
Jpn. J. Appl. Phys., vol. 28, No. 2, pp. L236–L238 (Feb. 1989).
Truman, J. K. et al., "Investigation of $SrTiO_3$ Barrier Layers for RF Sputter-Deposited Y-Ba-Cu-O Films on Si and Sapphire", Published by the Dept. of Materials Science and Engineering, University of Florida (1988).
Ma, Q. Y. et al., "Interdiffusion Between Si Substrates and YBaCuO Films," Reprint from materials distributed at International $M^2S$-HTSC Conference, Stanford, California (Jul. 1989).

(List continued on next page.)

*Primary Examiner*—Roy King
*Attorney, Agent, or Firm*—Deveau, Colton & Marquis

[57] ABSTRACT

A method for applying a metal film barrier layer between a substrate and a superconductor coating or over a superconductivity coating using chemical vapor deposition in which low vapor pressure reactants are used, is disclosed, which comprises the steps of providing a substrate and a quantity of metal-bearing reagent and one or more reagents, placing the substrate within the furnace, introducing the metal-bearing reagent by a powder feeder means and then the reagents at different times into and reacting them in the furnace, resulting in the deposition first of a coating of metal onto the substrate and then of a coating consisting essentially of the superconducting reactant components onto the metal film; said reagents generally chosen to yield the group of oxide superconductors.

14 Claims, 16 Drawing Sheets

OTHER PUBLICATIONS

Chen, J. M. et al., "Study of Interaction Between $ZrO_2$ (YSZ) Substrates and $YBa_2Cu_3O_{7-\delta}$ Superconducting Films", Appl. Phys. A., vol. 48, pp. 277–281 (1989).

Singh, R. et al., "Preparation of $BaF_2$ Films by Metal Organic Chemical Vapor Deposition", Published by the School of Electrical Engineering and Computer Science, University of Oklahoma, Norman (1989).

Hollabough et al., "Chemical Vapor Deposition of ZrC Made by Reactions of $ZrCl_4$ with $CH_4$ and with $C_3H_6$," Nod. Tech., vol. 35, No. 9, p. 527 (1977).

Gurvitch, M. et al., "Preparation and Substrate Reactions of Superconducting Y–Ba–Cu–O Films", Appl. Phys. Lett., vol. 51, No. 13, pp. 1027–1029 (Sep. 1987).

30 TORR, 700°C

30 TORR, 500°C

30 TORR, 300°C

630 TORR, 700°C

630 TORR, 500°C

630 TORR, 300°C

METHOD FOR THE CHEMICAL VAPOR DEPOSITION OF GROUP IB AND GROUP VIIIB METAL BARRIER LAYERS

STATEMENT OF RELATED APPLICATIONS

This application is a continuation-in-part of co-pending application Ser. No. 07/439,843, filed on Nov. 21, 1989, now U.S. Pat. No. 5,108,983.

BACKGROUND OF THE INVENTION

1. Field of the Invention

This invention relates generally to the chemical vapor deposition of Group IB and Group VIII metal films on substrates and more specifically to the chemical vapor deposition of Group IB and Group VIII metal films as a layer on a substrate on which a superconductor will then be deposited, such that the silver film is located between the substrate and the superconductor, thus improving the subsequent superconducting properties of the superconductor. The chemical vapor deposition of both the metal film and the superconductor is accomplished generally by the use of low vapor pressure reactants and more specifically by the use of powder feeding of low vapor pressure reactants into the chemical vapor deposition furnace.

2. Prior Art

A. Barrier Layers

Silver films were deposited on silicon substrates by Voorhoeve et al., 119 J. Electrochem. Soc. 364 (1972), by etching a silicon wafer using AgF. However, Voorhoeve et al. discloses an approach that is applicable only to coating a silver film on a silicon substrate; that is, the reagent must have silicon present to react with so as to make it possible to deposit silver. Using the Vooroeve et al. method, the formation of a silver film has been demonstrated only on silicon. Laser assisted CVD using the organometallic Ag(TFA) recently was reported in an anonymous research disclosure. 263 Research Disclosure 146 (1986). However, laser assisted CVD has only limited applicability and is not amenable to coating large areas or fibers at any practical speeds.

Another study used the Ag(PF) reagent to demonstrate its feasibility as a reagent, in which several flat substrates were coated with silver, including silicon, quartz, and glass. Oehr et al., 49 Appl. Phys. A. 691–696 (1989). Oehr et al. discloses the use of plasma enhanced CVD, which yields very low deposition rates, on the order of 1 to 5.5 nm/min. Higher deposition rates using the Oehr et al. method results in poorer quality metallic silver films which have a polymeric character and higher resistivities. Also, plasma enhanced CVD is not as applicable to coating large areas and multiple substrates as conventional CVD, and is not very practical for coating fiber tows at high rates, because the plasma coating region typically is small compared to the furnace size (coating region) for conventional CVD.

Two patents on the deposition of Group IB metals have been issued to Erbil, U.S. Pat. No. 4,880,670, and to Beach et al., EPO No. 0297348. Very little prior research has been conducted on depositing silver films. Specifically, the inventors are unaware of any process details for depositing uniform silver films and prior to the present work, the inventors were not confident that conformed, uniform silver films could be applied. It was certainly unclear to those skilled in the art as to whether silver could be applied uniformly to each filament of a fiber tow and, even more importantly, prior art silver films were not developed for interlayer use. Therefore, the use of chemically vapor deposited silver as a barrier layer coating between fiber substrate and superconductor is unique work.

The use of a non-specified, but compressable, barrier layer between a fiber tow and a superconducting coating has been disclosed in the patent to Satek et al., U.S. Pat. No. 4,975,413. However, this compressable layer is to prevent the superconducting coating from cracking, loosening or peeling due to thermal expansion and contraction of the fiber tow and/or the superconducting coating. The use of silver as a protective layer between the compressable layer and the superconducting coating also is disclosed; however, the combination of chemically vapor deposited silver on a fiber tow and chemically vapor deposited superconducting coating on the silver barrier layer is not diclosed. Until the present invention, the CVD of silver for protecting superconductors from reacting with the substrate had not been used. Further, until the present invention, the application of a uniform coating over each individual filament of a fiber tow had not been accomplished—typical coating layers varied from angstroms in one area to nanometers or thicker in other areas.

Other barrier layer materials, however, have been pursued. Pure metal and $ZrO_2$ films have been popular choices to inhibit film/substrate interactions. Zirconia films were evaporated and sputtered onto polycrystalline alumina and silicon, resulting in an increase in the critical temperatures of the superconducting compound deposited on top of the material. Mogro-Campero et al., 53 Appl. Phys. Lett. 2566 (1988); Greve et al., Influence of $Y_2O_3/ZrO_2$ Buffer Layers on Sputtered Films of YBCO, Dept. Elec. and Comp. Eng., CMU. Indium-Tin-Oxide films have also been evaporated in order to prevent substrate/film interaction. Fujino, 28 Jpn J. Appl. Phys. L236 (1989). $SrTiO_3$ was used as a barrier layer, however, the formation of $BaSiO_3$ was not prevented and the resulting superconducting properties were not improved. Truman et al., Investigation of $SrTiO_3$ Barrier Layers for RF Sputter-Deposited YBaCuO Films on Si and Sapphire, Dept. Mat. Sci. and Eng., U. Fla. Other metal films including Ag, Au, and Nb have been evaporated to act as a barrier layer. Ma et al., Interdiffusion Between Si Substrates and YBaCuO Films, Int'l HTSC Conf. (1989); Chen et al., 48 Appl. Phys. A. 277 (1989); Gurvitch et al., 51 Appl. Phys. Lett. 1027 (1987). Finally, $BaF_2$ deposited using a CVD technique was used as a barrier layer on Si and $ZrO_2$ substrates. Singh et al., Preparation of $BaF_2$ films by Metal Organic Chemical Vapor Deposition, Sch. Elec. Eng and Comp. Sci., U. Ok. at Norman. Thus, although barrier layers are known to prevent unwanted reaction between coating and substrate, the specific choice of a Group IB or Group VIII metal, such as silver, deposited directly onto the fiber substrate has not been disclosed.

B. Chemical Vapor Deposition

Current techniques in chemical vapor deposition ("CVD") which use low vapor pressure reagents introduce the reactant material too slowly into the reactor, which reduces the coating deposition rate. Common solutions to this problem of reduced coating deposition rate include: running the vaporizer or reactor at reduced pressures, which increases the transport rate of the reagent into the reactor; running the reactor with a high carrier gas flow rate, which tends to dilute the reactant gas stream since saturation may not be achieved; or heating the solid or liquid reactants to a high temperature, which increases the vapor pressure above the reactant.

Current coating techniques usually do not include the powder feeding of low vapor pressure reactants to increase the deposition rate. One introduction technique consists of a process where reagents which are dissolved to form a liquid solution are then sprayed into a furnace to form a powder of superconducting oxides. One coating technique consists of a process where substrates are coated with superconducting oxides by spraying the substrates with or dipping the substrates in liquid reactants. These, however, are not CVD processes and do not result in an atom-by-atom build-up of the coating. These coatings, therefore, do not possess the high degree of crystalline perfection found in CVD coatings.

Previous CVD techniques have used an auger to feed $ZrCl_4$ powder into a CVD furnace as an alternative to the use of a vaporizer. Hollabough et al., Chemical Vapor Deposition Of ZrC Made By Reactions Of $ZrCl_4$ With $CH_4$ And With $C_3H_6$, 37253 5, (9), Nucl. Tech., 527-35 (1977). This approach used powder feeding of $ZrCl_4$ as a reagent to CVD furnaces instead of using a vaporizer. However, the powder feeding method was used in place of a vaporizer because, depending on the CVD furnace design, it is sometimes difficult to keep the portion of the reagent gas line connecting a vaporizer with a CVD furnace at a sufficiently high temperature. This approach was used not because the vapor pressure of the reactant, $ZrCl_4$, is low or because heating of $ZrCl_4$ renders it unstable, but because a relatively high temperature is required to develop the desired vapor pressure and maintaining the high temperature throughout the gas lines going to the furnace often is difficult.

U.S. Pat. No. 4,202,931 to Newkirk et al. discloses the use of a powder feeder to prepare a $Nb_3Ge$ low temperature superconductor. However, use of a powder feeder was known prior to this patent, as disclosed in U.S. Pat. No. 4,054,686, also to Newkirk et al. See also the paper by Hollabough et al. referenced above. Newkirk et al., U.S. Pat. No. 4,202,931, disclosed the use of a powder feeder to improve the control or accuracy of $NbCl_5$ dispensing.

None of the prior art techniques have been applied to the powder feeding of the new generation of high temperature superconducting oxides, into CVD furnaces, nor have they been designed to achieve the high deposition rates desired for superconductors and other materials. The prior art techniques are suitable for the deposition of Nb and Zr compounds, as high deposition rates for these compounds can be achieved without powder feeding, for example, by vaporization of $NbCl_5$ and $ZrCl_4$. Vaporization cannot yield the high deposition rates for oxide superconductors, because oxide superconductor reagents have very low vapor pressures and cannot be practically (i.e., rapidly) introduced into a CVD furnace using vaporization techniques.

Thus, when the reagents $ZrCl_4$ and $NbCl_5$ were introduced via powder feeding in the prior art, it was merely at the discretion of the investigator as a matter of convenience and as an attempt to improve the accuracy of reagent flowrate, rather than for the purpose of increasing deposition rate. However, in the case of the very low vapor pressure reagents, the use of powder feeding is mandatory in order to achieve high deposition rates, and also maintains the control over reagent flowrate (i.e. process repeatability) much more so than in the case of high vapor pressure reagents such as $ZrCl_4$ and $NbCl_5$ where vapor pressures can be controlled easily and are highly reproducible. The use of powder feeding to introduce the reagents to the CVD process achieves higher deposition rates—2-10 micrometers/hr (33-167 nm/min) for the present process versus 1-5.5 nm/min for prior published processes. Further, although the powder feeding of certain materials is known in the art, such powder feeding has not been extended to the use of reagents bearing Group IB and Group VIII compounds.

Chemical vapor deposition is used extensively for the commercial preparation of numerous electronic, optical, tribological, and chemically protective coatings. Compared to other coating processes, CVD is often faster, yields higher quality, more adherent films, and can be used to coat multiple, irregularly shaped substrates. Films of the high $T_c$ oxide superconductor $YBa_2Cu_3O_x$ have been prepared by CVD; however, no such oxide superconducter films have been prepared which also use CVD deposited silver barrier layers to improve the superconductivity. Typical reagents used in CVD processes for the oxide superconductors have consisted of metal complexes of various beta-diketonate ligands, which are solids at room temperature and which slowly sublime when heated to about 100°-300° C.; however, the very low vapor pressure of the precursor reagents has restricted deposition rates to low values, e.g. 1 micron per hour. Furthermore, the vapor pressures of the reagents are strongly dependent on temperature and are subject to change as a result of thermal-environmental induced degradation during sublimation. Hence, process control and repeatability are unusually poor.

BRIEF SUMMARY OF THE INVENTION

The present invention was developed to solve the problems not addressed by the prior art by allowing for the uniform coating of a Group IB or Group VIII metal barrier layer onto a substrate which may have multi-dimensional contours, using CVD, and the subsequent coating of a superconductor onto the barrier layer, also using CVD, so as to improve the superconducting properties of the resulting composite. The use of powder feeding technology to introduce the reagents to the CVD furnace allows the uniform deposition of coating layers at uniformities and deposition rates heretofore not achieved.

The chemical vapor deposition of metal films is used to improve the subsequent superconducting properties of oxide superconductors, such as a $YBa_2Cu_3O_x$ thin film, deposited on a variety of substrate materials. The metal film acts as a barrier layer prohibiting chemical interaction between the $YBa_2Cu_3O_x$ coating and the substrate. For example, when depositing the $YBa_2Cu_3O_x$ material on $Al_2O_3$, an undesired reaction resulting in $BaAl_2O_4$ formation occurs. Using a metal barrier prevents the reaction and therefore improves the quality of the superconducting properties on single or polycrystalline substrate materials.

The preferred metals for use as the barrier layer are the Group IB and Group VIII metals, with silver, gold, paladium, irridium and rhodium being the most preferable. Silver, being the most abundant and economical, is the metal of choice, and will serve as the example metal for this Specification.

Silver films can be deposited using inorganic reagents, such as silver halide (AgI, AgBr) reagents, and silver organometallic [silver trifluoroacetylacetonate, Ag(TFA); and, preferably, perfluoro-1-methylpropenylsilver, Ag(PF)]reagents. The films can be deposited on both flat substrates and irregularly shaped substrates, such as multifilament fiber alumina and carbon substrates. The use of a chemical vapor deposition approach enables the infiltration and coating of each individual filament of a fiber tow, as opposed to a sputtering or evaporation line of sight technique, and can be completed at relatively low temperatures, 250°–500° C., and pressures, $10^{-3}$–1 atm.

The silver reagents are introduced into the CVD furnace using a powder feeding approach due to the low vapor pressure of the reagents. This also results in a faster, more controllable and potentially more economical CVD process. The higher deposition rate also permits the coating of substrates which would be damaged by prolonged exposure to a high temperature oxygen environment. Typically, about 2–10 grams of the reagents were fed using a vibratory bowl feeder; argon or $H_2$ gas at typically about 5 l/min pneumatically transported the material to the furnace, where it was mixed with hydrogen. Continuous deposits were observed when using AgI, Ag(TFA), and Ag(PF).

This invention also relates to a method and apparatus for introducing low vapor pressure solid reactants into a CVD furnace to produce the barrier layer. CVD currently is being used to deposit a variety of coatings onto appropriate substrates. In conventional CVD processing, gases are typically used to transport the reagents into the furnace, where the reagents combine to form the desired coating. When liquid and solid reactants are used in conventional CVD processing, a carrier gas is bubbled or blown over the liquid or solid reactants to transport reagent vapor into the furnace. The materials then react in the furnace to deposit the coating.

The method and apparatus of the present invention achieves a faster, more reliable processing technique that successfully deposits coating materials on substrates, and allows for the deposition of first the barrier layer and second the oxide superconductor layer in a continuous manner. Additionally, the use of the powder feeding approach specifically for the purpose of avoiding problems such as low deposition rate and the poor repeatability associated with the use of very low vapor pressure CVD reagents has not been used in connection with the deposition of silver barrier layers and the later deposition of oxide superconductors prior to the development of the method and apparatus of this invention.

Accordingly, it is an object of the present invention to provide a method and apparatus for the deposition of silver film barrier layers by chemical vapor deposition to improve the superconducting properties of a superconductor subsequently deposited over the silver film.

It is another object of the present invention to provide a method and apparatus for improving the superconducting properties of a superconductor while reducing the interaction between the superconductor coating and the substrate or process environment.

Another object of the present invention is to provide a method and apparatus for improving the superconducting properties of a superconductor without degrading the electrical properties.

Still another object of the present invention is to provide a method and apparatus for improving the superconducting properties of a superconductor which can be used to coat irregularly shaped objects.

It is another object of the present invention to provide a method and apparatus for improving the superconducting properties of a superconductor which has improved reproducibility, requires simpler equipment and operation needs and less operator skills, and utilizes low cost reagents.

It is still another object of the present invention to provide a method and apparatus for improving the superconducting properties of a superconductor which is simpler, more economical, and more reliable than previous methods.

It is another object of the present invention to provide a method and apparatus for improving the superconducting properties of a superconductor which allows the coating of coated wires, tapes, cavities and electronic devices.

These and other objects will become apparent to those skilled in the art when taken in conjunction with the following drawings and the detailed description of the method and apparatus contemplated by the present invention.

DETAILED DESCRIPTION OF THE INVENTION

1. Theoretical

The novel approach for the CVD of silver films disclosed herein utilizes three original concepts. First, it uses the powder feeding approach in order to introduce a low vapor pressure metallic reagent responsible for the deposition. Second, it successfully accomplishes the elimination of any chemical interaction between the substrate and the superconducting compound. Third, it protects the substrate from reaction with the process environment, e.g. prevents oxidation of substrates. The infiltration and coating of individual filaments of a fiber tow verifies the process is by vapor deposition, as opposed to common sputtering or evaporation techniques commonly used in the microelectronics industry, and also as opposed to a powder spraying process.

The present invention allows any substrate material to be coated successfully with the superconducting material without the drawback of chemical interaction. The silver material does not degrade the superconducting properties, protects the integrity of the coating, and results in the widening of potential uses for the superconducting films. Substrates which contain silicon, aluminum, and other elements which are known to interact adversely with the $YBa_2Cu_3O_x$ initially can be coated with silver to prevent interaction. Also, since this is a CVD process, any irregularly shaped object (tubes, fiber tows, etc.) can be coated prior to using CVD or other methods to deposit the superconducting compound. The prior art technology does not overcome the interaction layer problem.

The chemical vapor deposition of silver films is used to improve the subsequent superconducting properties of a $YBa_2Cu_3O_x$ thin film deposited on a variety of substrate materials. The silver film acts as a barrier layer prohibiting chemical interaction between the $YBa_2Cu_3O_x$ coating and the substrate. For example, when depositing the $YBa_2Cu_3O_x$ material on $Al_2O_3$, an undesired reaction resulting in $BaAl_2O_4$ formation occurs. Using a silver barrier prevents the reaction and therefore improves the quality of the superconducting properties on a variety of polycrystalline and single crystal substrate materials.

Figure 1:
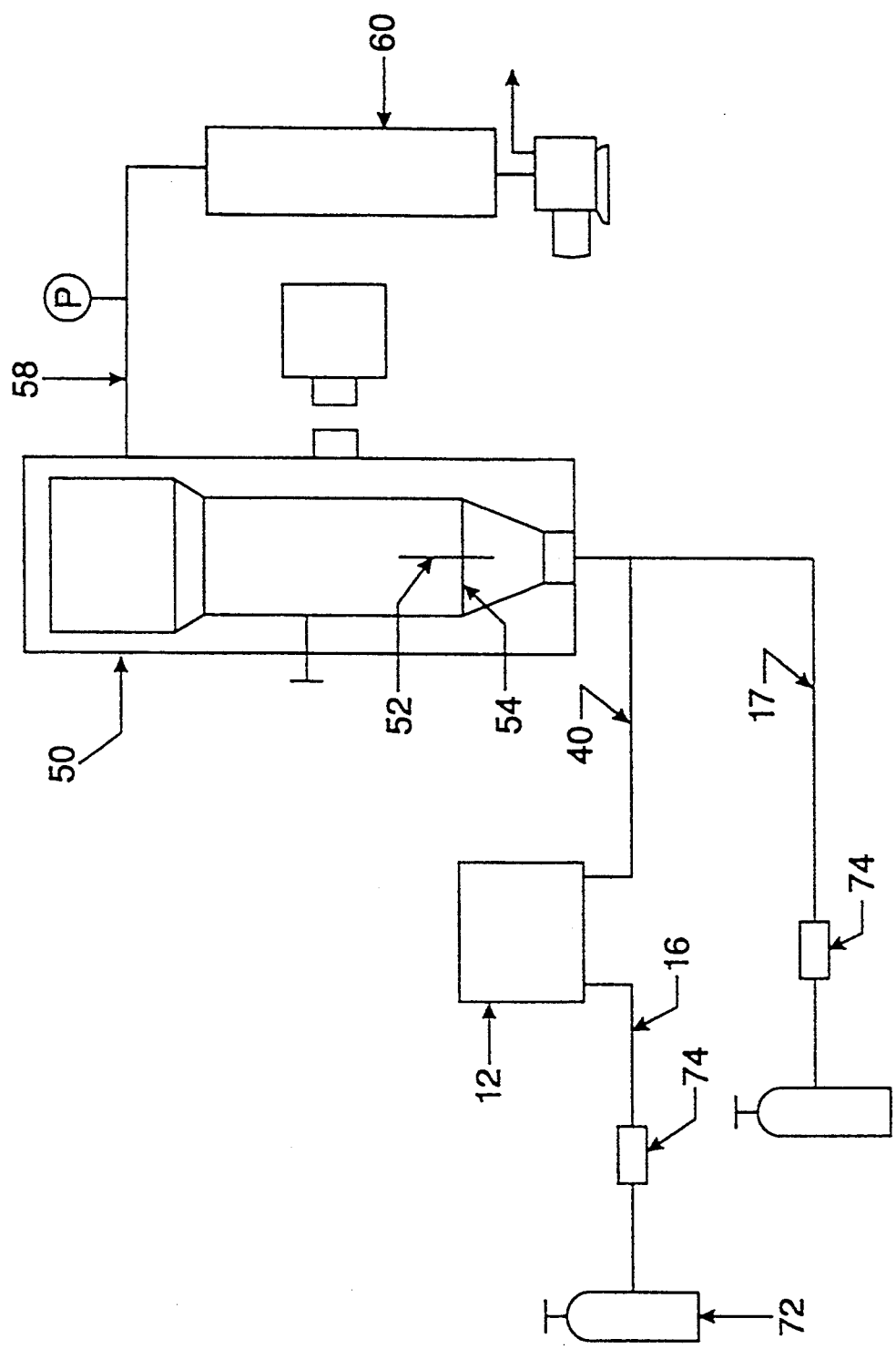
FIG. 1 is a schematic of the CVD deposition equipment used to deposit silver films according to the present invention.
Figure 2:
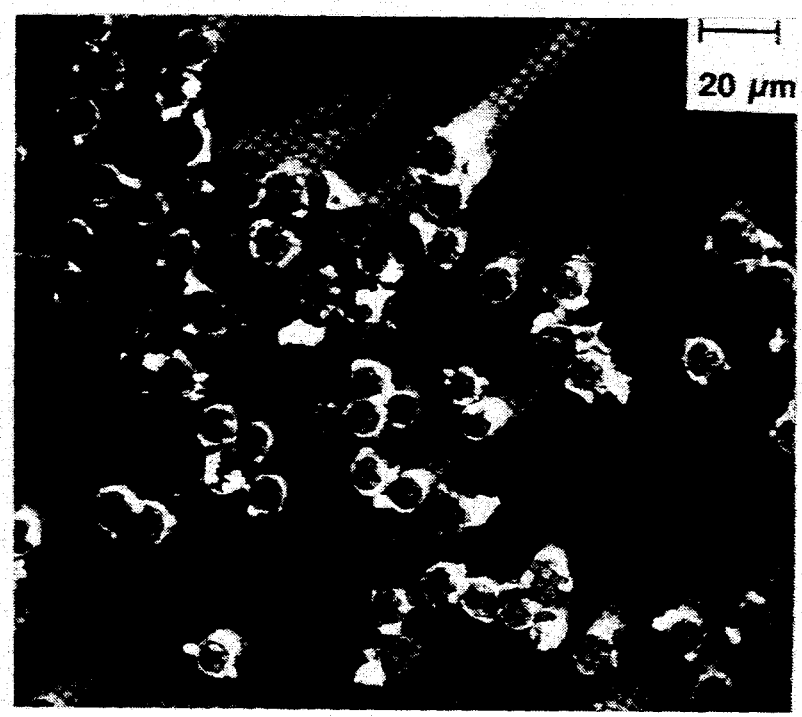
FIG. 2 is a micrograph showing a fiber tow uniformly coated with a silver film according to the present invention.

Silver films were deposited using inorganic reagents, such as silver halide (AgI, AgBr) reagents, and organometallic reagents, such as silver trifluoroacetylacetonate, Ag(TFA); and, preferably, perfluoro-1-methylpropenylsilver, Ag(PF). The films were deposited on both flat and multifilament fiber alumina and carbon substrates. A schematic of the deposition system is shown in FIG. 1. The use of a chemical vapor deposition approach enables the infiltration and coating of each individual filament of a fiber tow, or each crevice of an irregularly-shaped substrate, as opposed to a sputtering or evaporation line of sight technique, and can be completed at relatively low temperatures, 250°–500° C., and pressures, $10^{-3}$ to 1. FIG. 2 presents a micrograph showing the uniform silver deposition on the filaments of a fiber tow.

Figure 12:
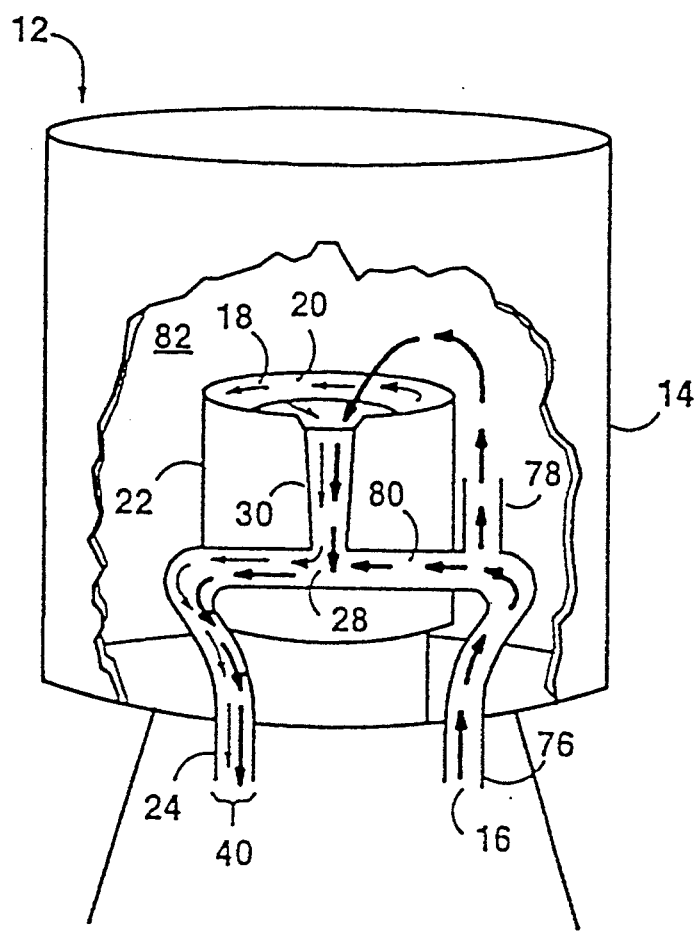
FIG. 12 is a schematic of the vibratory powder feeder for the superconductor CVD.

The silver reagents are introduced into the CVD furnace using a powder feeding approach. This is necessary due to the low vapor pressure of the reagents, and provides a more uniform layer, having a more uniform coverage of the substrate, and a more uniform coat thickness. Typically, about 2–10 grams of the reagents are fed using a vibratory bowl feeder. It is preferable to use reagents having a particle size of less than 100 microns. A cross-section of the preferred vibratory bowl feeder is shown in FIG. 12. Argon or $H_2$ gas at typically 5 l/min pneumatically transports the material to the furnace, where it is mixed with hydrogen. Continuous deposits are observed when using reagents which are not metal-organics, such as AgI, and reagents which are metal-organics, such as Ag(TFA) and Ag(PF).

Figure 3:
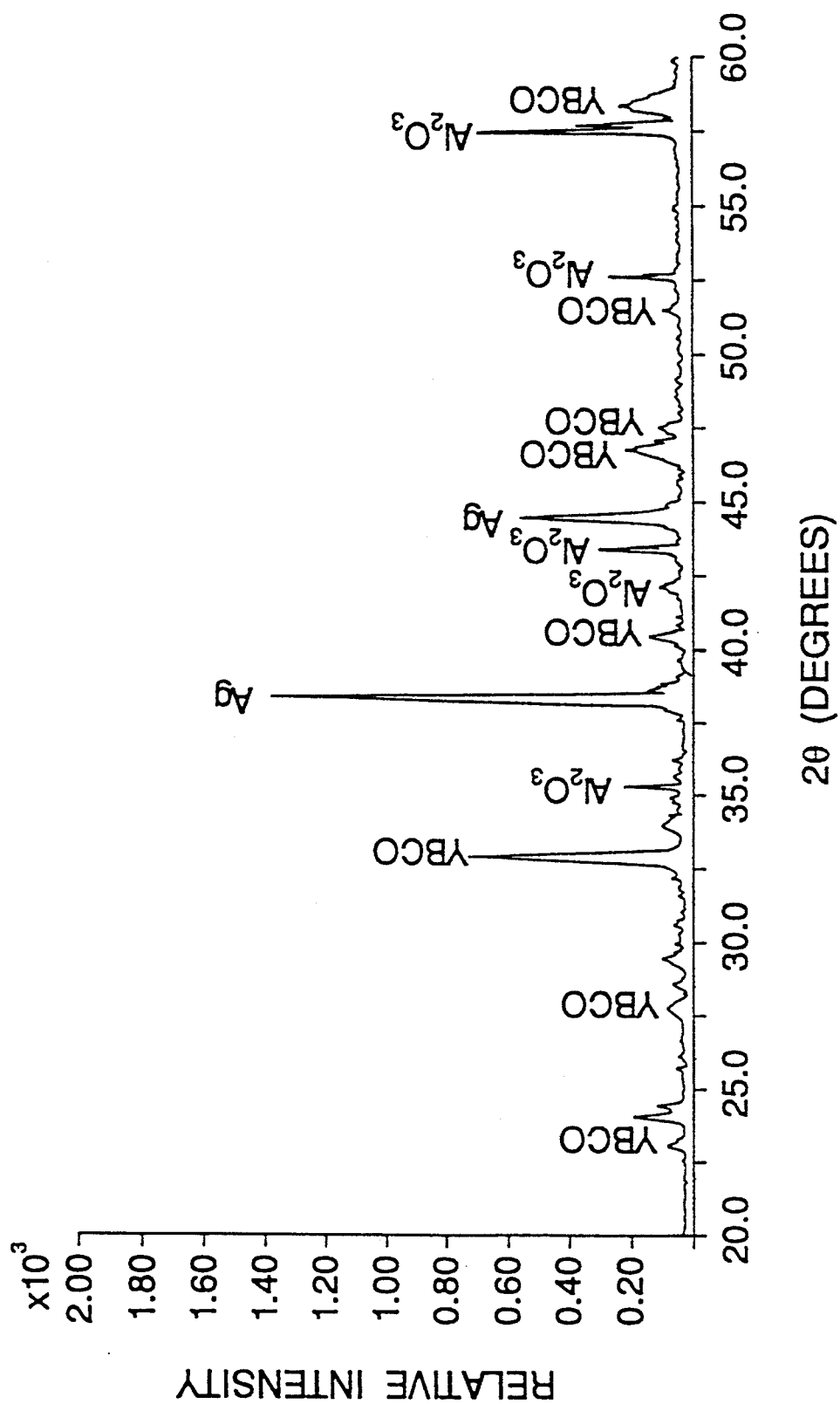
FIG. 3 is an x-ray diffraction pattern of a $YBa_2Cu_3O_x$ film deposited on an alumina substrate coated with a silver film according to the present invention.
Figure 4A:
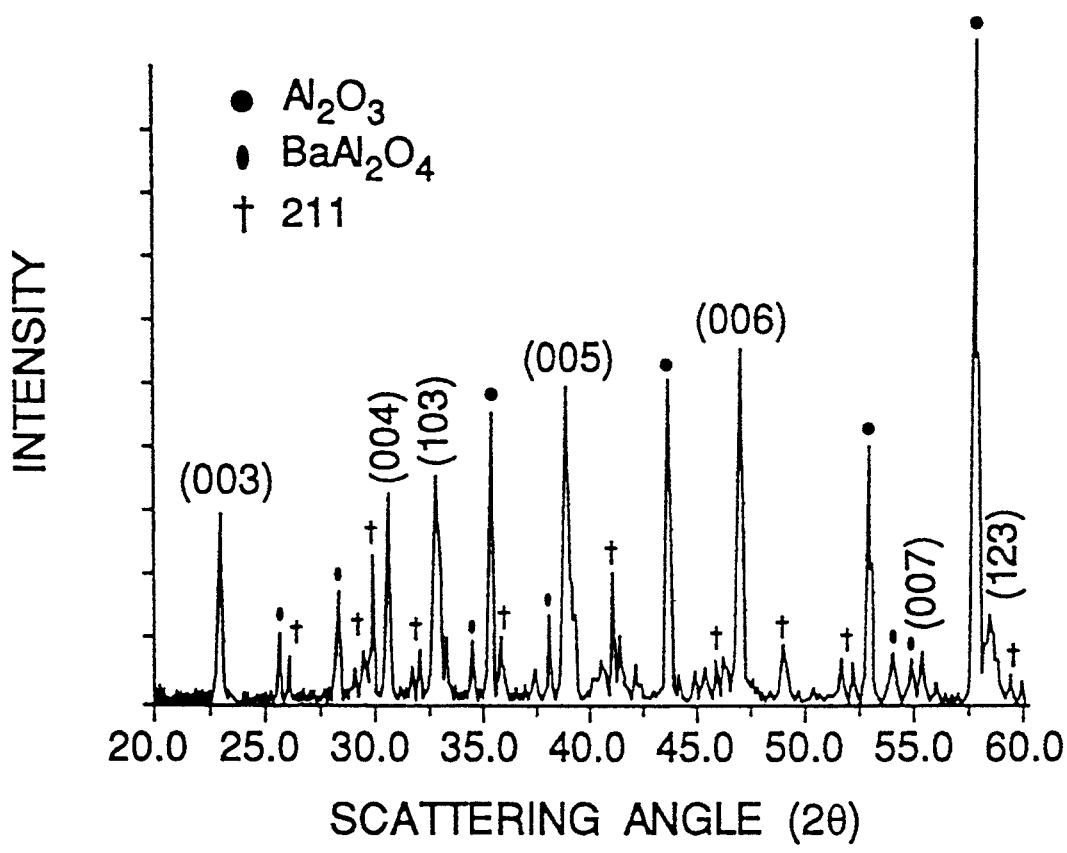
FIGS. 4(a) and 4(b) are x-ray diffraction scans of $YBa_2Cu_3O_x$ films on polycrystalline alumina, with FIG. 4(a) as deposited and FIG. 4(b) after annealing.
Figure 4B:
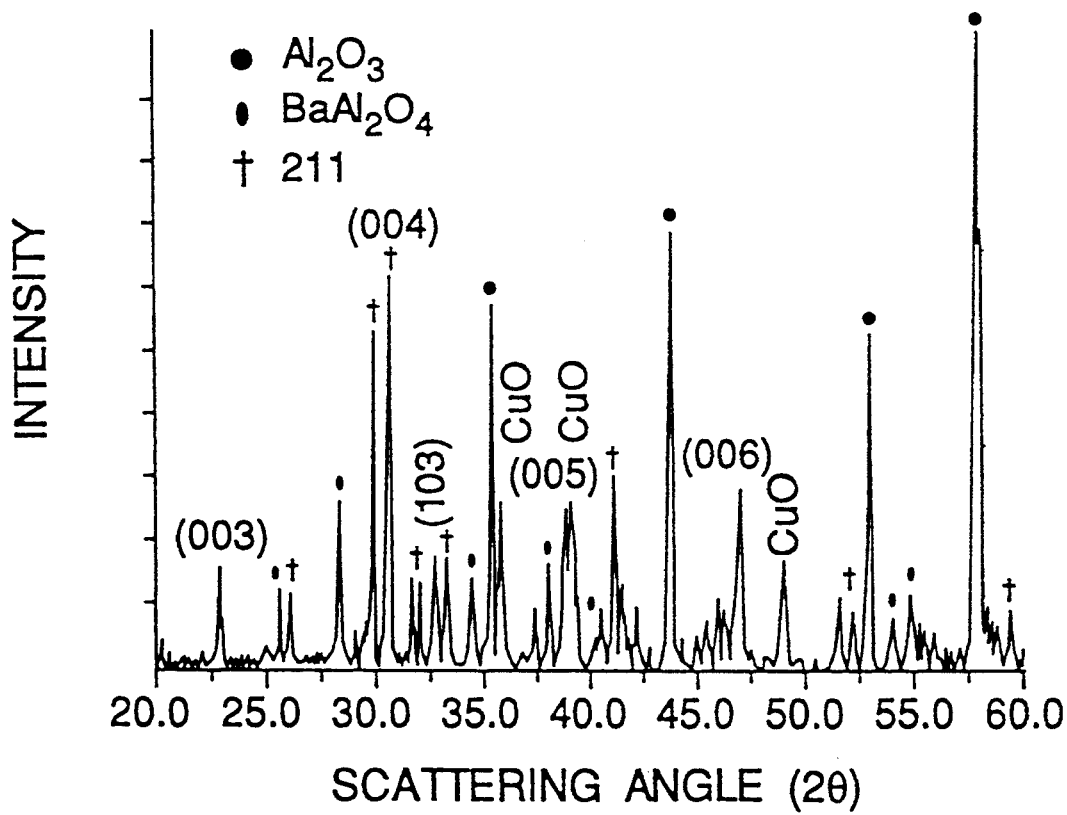
Figure 5:
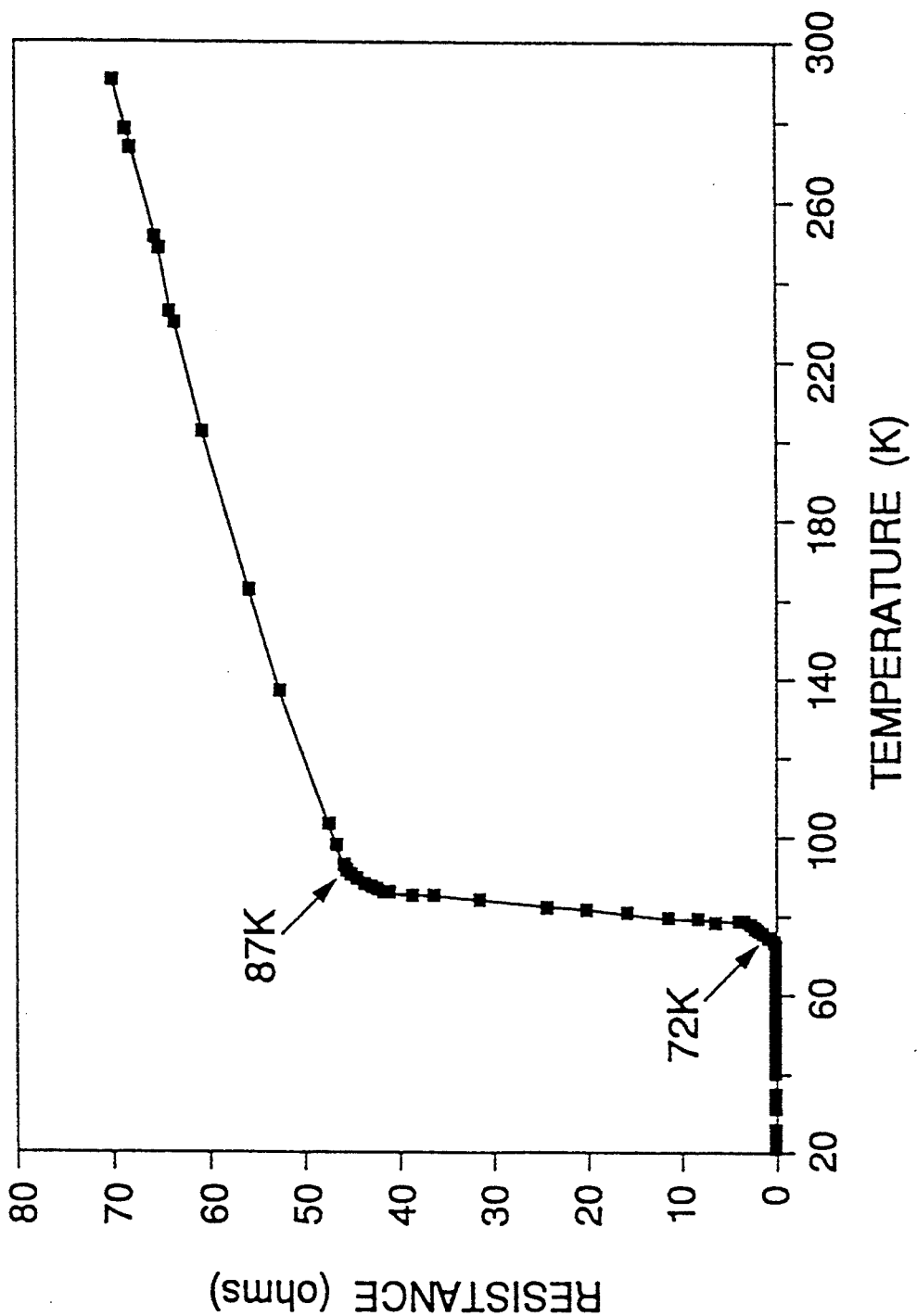
FIG. 5 is the resistance versus temperature graph of $YBa_2Cu_3O_x$ deposited on a fiber tow coated with a silver film according to the present invention, indicating superconductivity at 72K.

FIGS. 3 and 4 show x-ray diffraction patterns for $YBa_2Cu_3O_x$ deposited on $Al_2O_3$ substrates with and without a silver barrier layer. As shown, the formation of $BaAl_2O_4$ is prevented when using the silver. Critical temperature measurements also indicate the benefit of using a silver layer—an alumina tow coated first with silver, then with $YBa_2Cu_3O_x$, had a critical temperature of 72K as shown in FIG. 5. This is a higher critical temperature than achieved without the silver barrier layer. Analysis of the coatings using x-ray diffraction, scanning electron microscopy, two point resistance measurements, and auger spectroscopy was completed. Specific results showing the presence and quality of silver deposited are shown in FIGS. 6–10.

Figure 6:
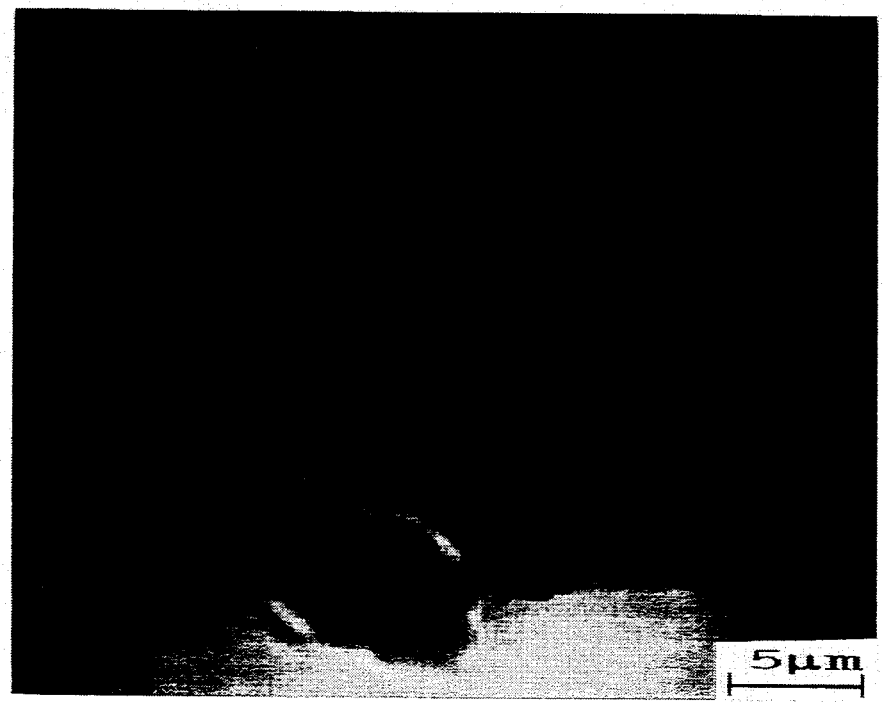
FIG. 6 is a micrograph of a cross-section of a silver film deposited from AgI according to the present invention.
Figure 7:
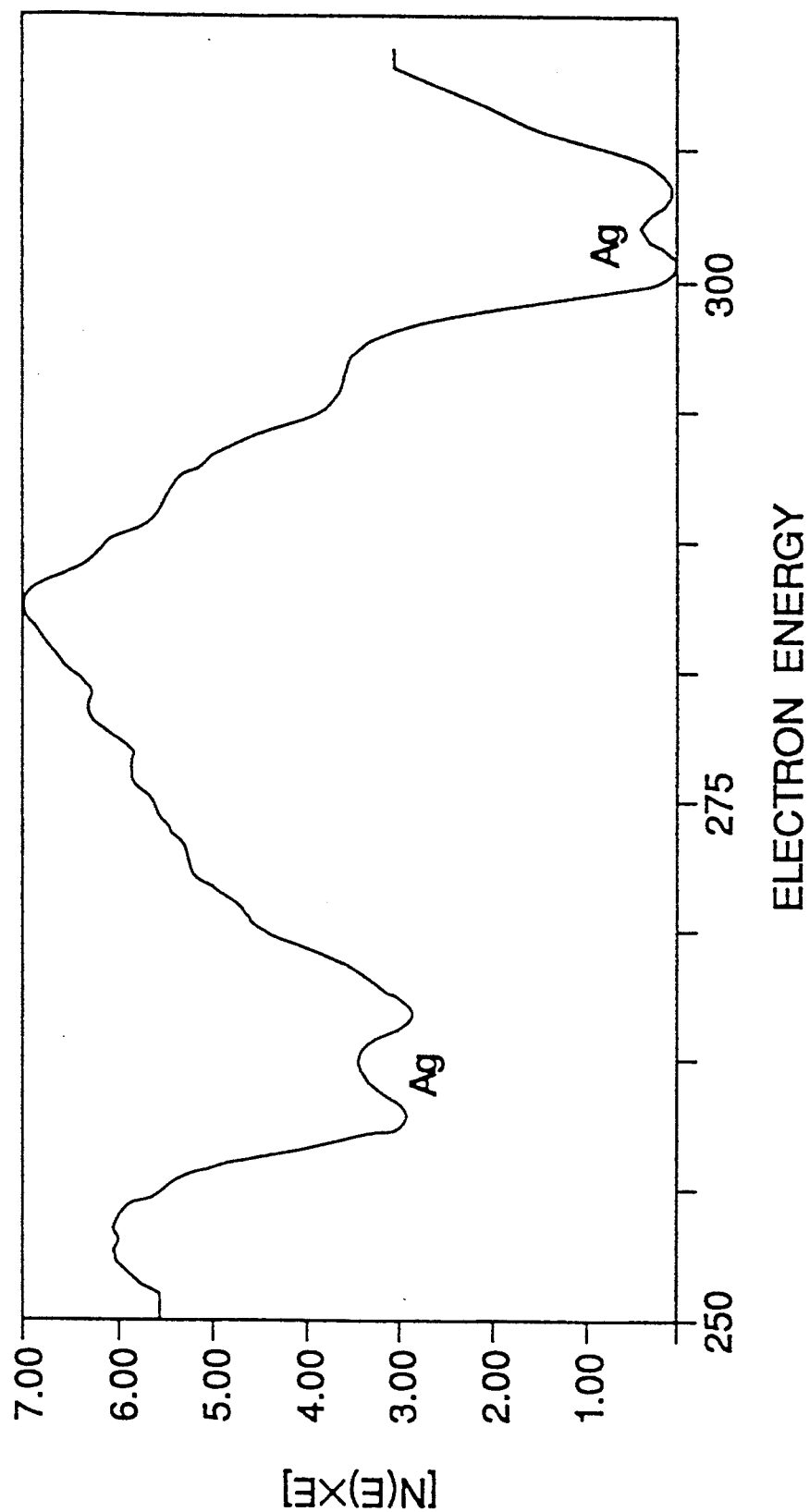
FIG. 7 is an AES survey of a sputtered-cleaned film produced from Ag(TFA) examined specifically for C.
Figure 8A:
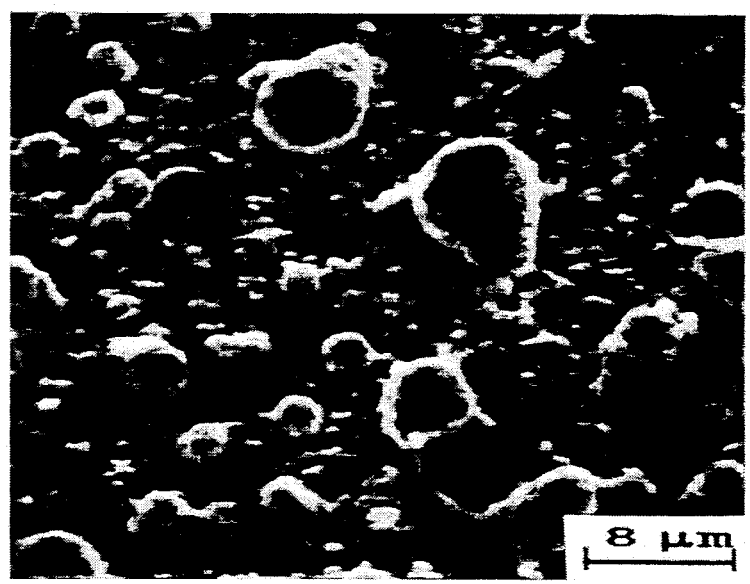
FIGS. 8(a), 8(b), 8(c) and 8(d) are scanning electron microscope images showing the effect of increasing $H_2$ flow on deposition from AgI and Ag(TFA), with FIG. 8(a) on deposition from AgI with a 0 l/min flow of $H_2$, FIG. 8(b) on deposition from AgI with a 2 l/min flow of $H_2$, FIG. 8(c) on deposition from Ag(TFA) with a 0.05 l/min flow of $H_2$, and FIG. 8(d) on deposition from Ag(TFA) with a 0.1 l/min flow of $H_2$.
Figure 8B:
Figure 8C:
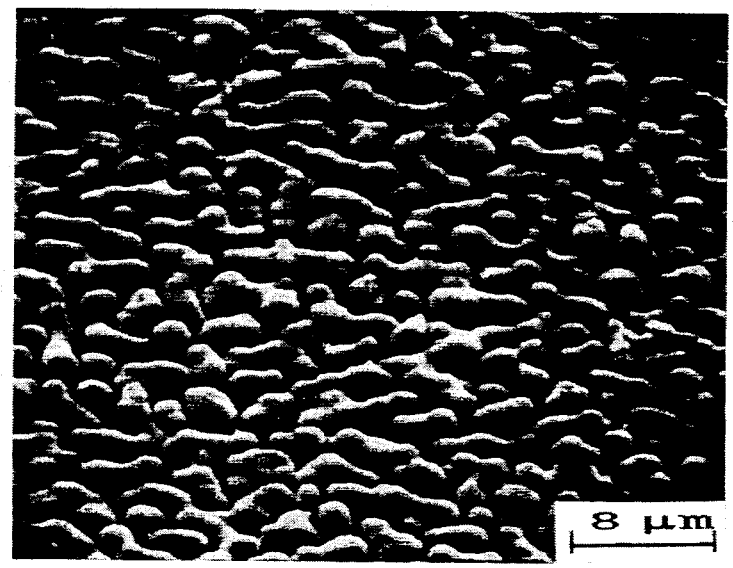
Figure 8D:
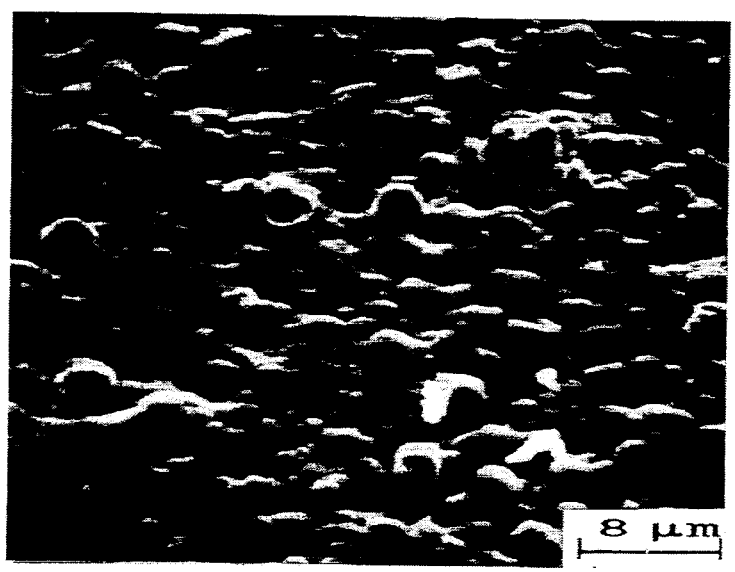
Figure 9A:
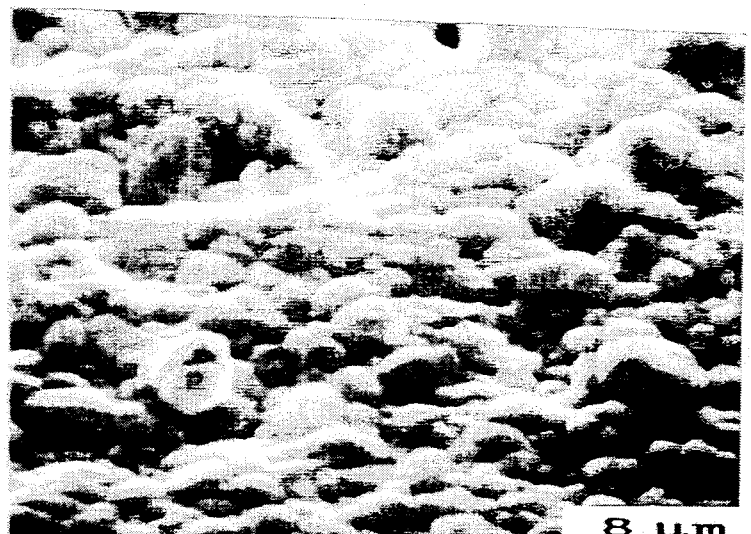
FIGS. 9(a), 9(b), 9(c), 9(d), 9(e) and 9(f) are micrographs showing the effect of temperature and pressure on the deposition of silver using Ag(PF), with FIG. 9(a) at 30 Torr and 700° C., FIG. 9(b) at 30 Torr and 500° C., FIG. 9(c) at 30 Torr and 300° C., FIG. 9(d) at 630 Torr and 700° C., FIG. 9(e) at 630 Torr and 500° C., and FIG. 9(f) at 630 Torr and 300° C.
Figure 9B:
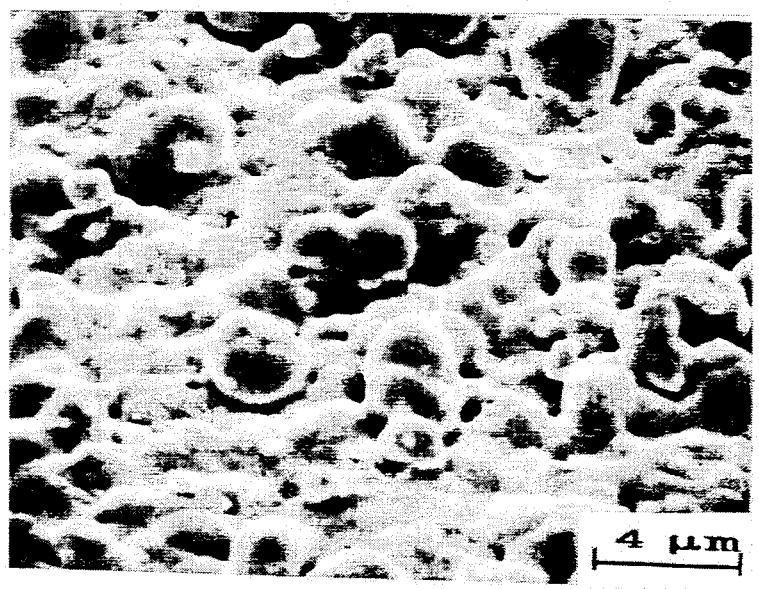
Figure 9C:
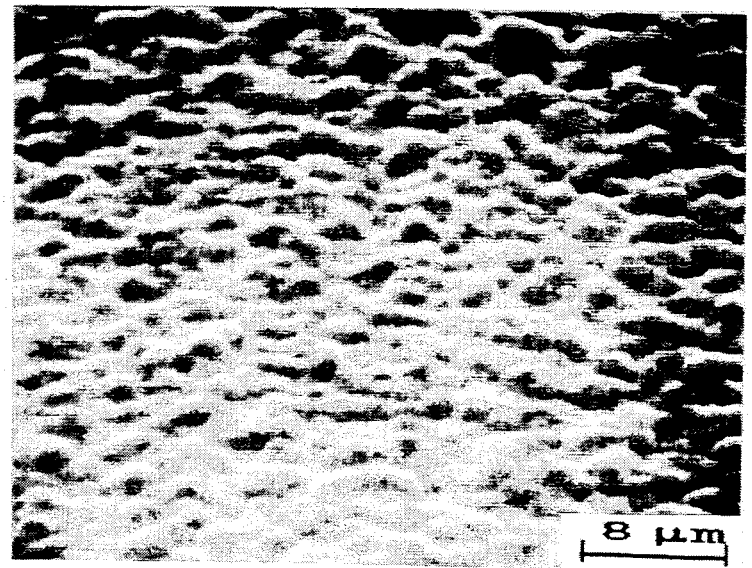
Figure 9D:
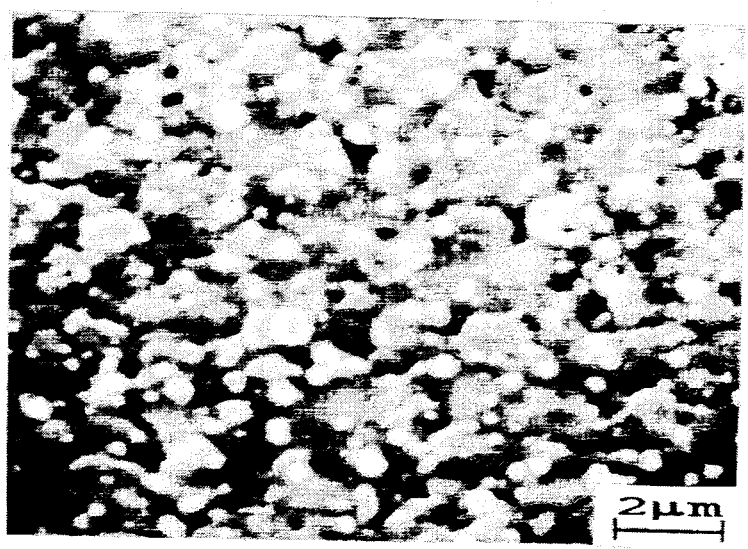
Figure 9E:
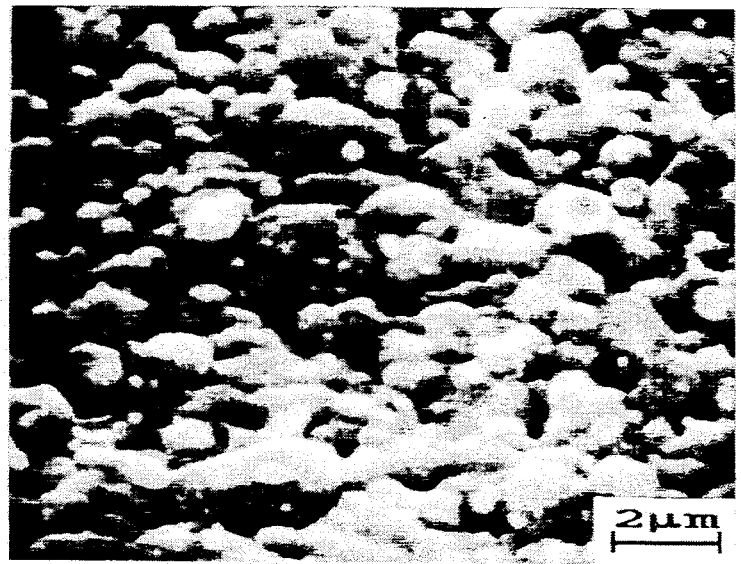
Figure 9F:
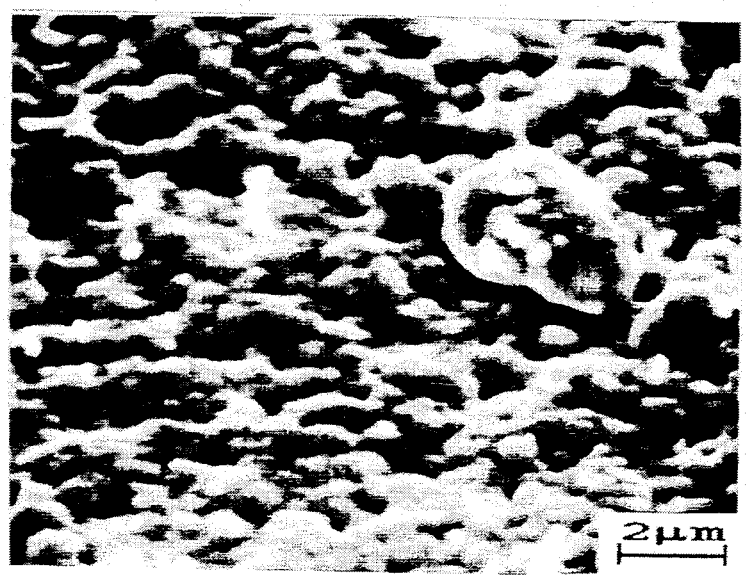
Figure 10:
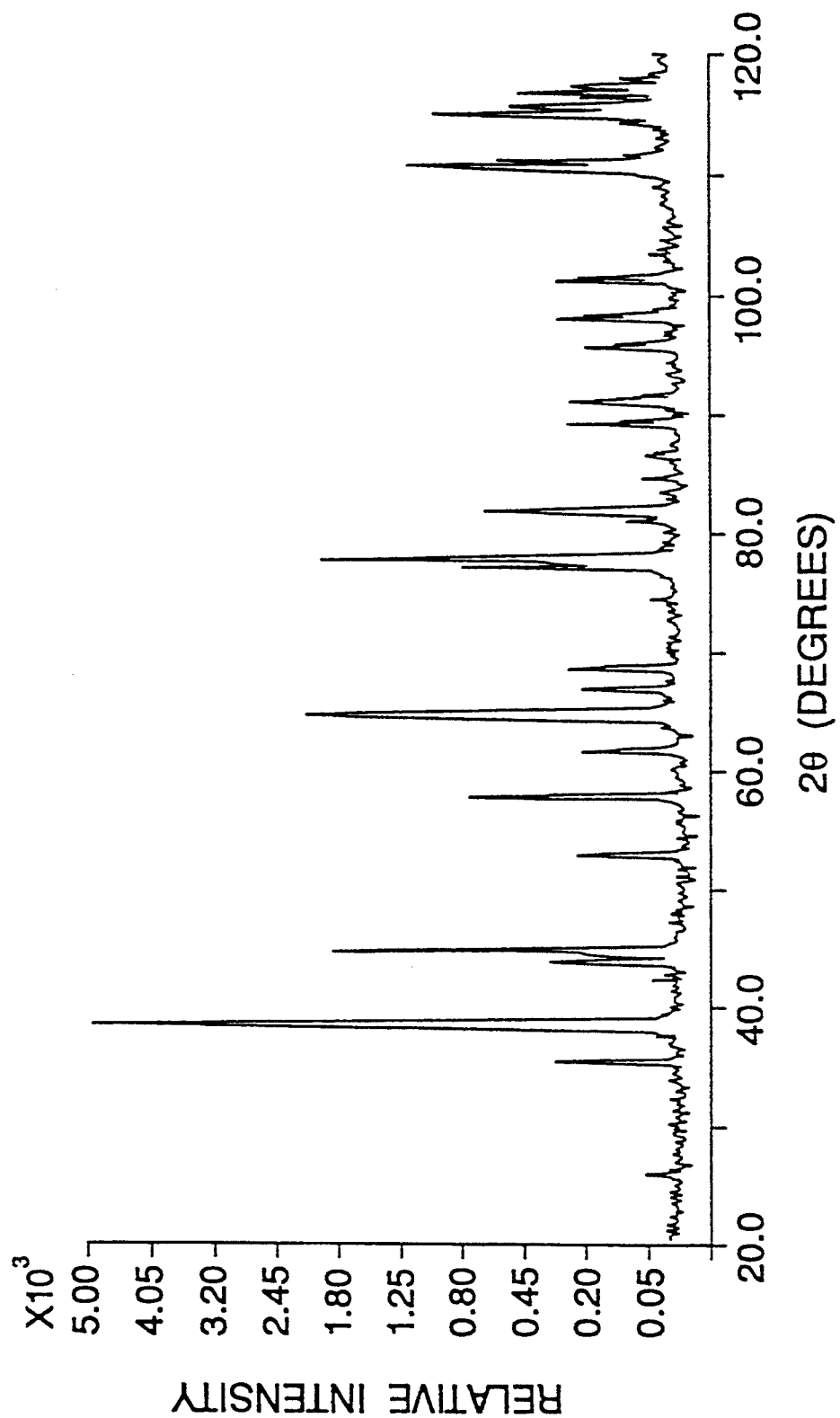
FIG. 10 is a sample x-ray diffraction pattern developed from the study of FIG. 9.
Figure 11:
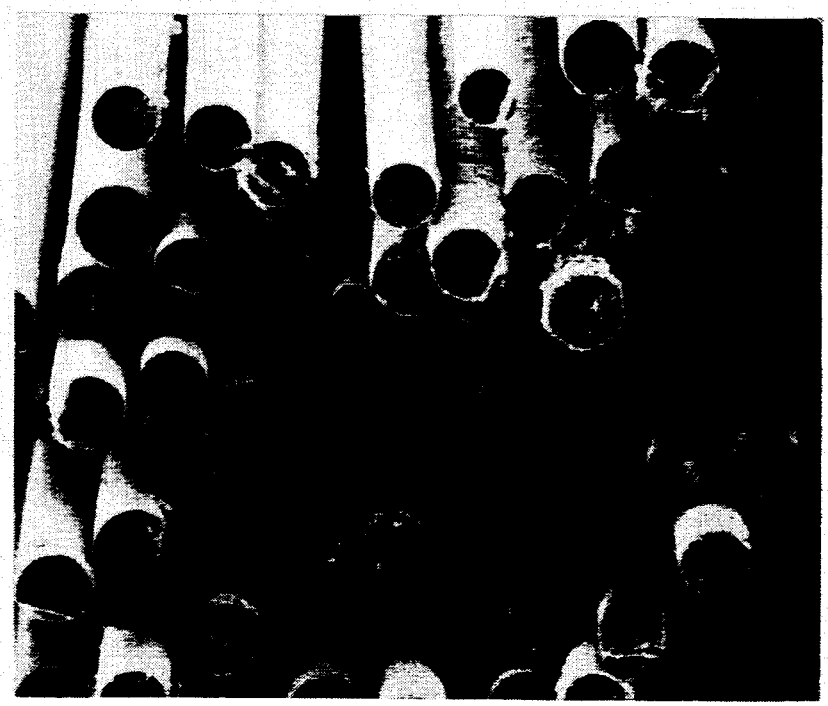
FIG. 11 is a scanning electron microscope image of a graphite tow coated with a silver film according to the present invention.

FIG. 6 is a micrograph showing a cross-section of silver film deposited from AgI. The morphology of this cross-section is similar to the morphology of the top surface of the film. As is evident, the morphology indicates a high quality, consistent layer with fewer impurities, a smaller bonding layer, and a greater infiltration in the substrate such that the substrate contours are uniformly coated. FIG. 7 is an AES survey of a sputter-cleaned silver film produced from Ag(TFA) which was examined specifically for C, none of which was found. FIG. 8 are scanning electron microscope images showing the effect of increasing the hydrogen flow on the film morphology from deposition from AgI and Ag(TFA). A greater hydrogen flow increases the continuity of the resulting film, resulting in a higher quality barrier layer. FIG. 9 are micrographs illustrating the effect of temperature and pressure on the deposition of silver films using Ag(PF). Lower pressures produce higher quality silver films. FIG. 10 is a typical x-ray diffraction pattern resulting from the deposition of silver films from Ag(PF). Then data were taken from the temperature versus pressure data study. Fractured cross sections were used to determine coating thickness and deposition rate, which ranged from 2 to 10 microns per hour. Finally, the use of silver in coating multifilament graphite tows has been achieved as shown in FIG. 11, a scanning electron micrograph of a graphite tow coated with silver, in which individual filament are uniformly coated.

The apparatus and method of the present invention is unique in several respects. First, the reagents are fed into the reactor using a powder feeder means, which results in a more reliable, repeatable deposition of the coating material onto the substrate. Second, the powder feeding approach also is used for the purpose of avoiding problems associated with the use of very low vapor pressure CVD reagents, such as low deposition rate and poor repeatability. Third, the reagents being used to deposit the superconductor coating materials, such as the oxide superconductors including $YBa_2Cu_3O_x$ and others that are unstable at temperatures required for their vaporization.

Suitable substrates include conventional substrates used in superconductor applications, such as single crystal magnesium oxide, single crystal aluminum oxide, single crystal strontium titanate, single crystal and polycrystalline zirconia ($ZrO_2$), planar polycrystalline aluminum oxide, and aluminum oxide, carbon, or other fibers. Additionally, ribbons or tapes of $Al_2O_3$, or other appropriate ceramics or metals, and fiber tows of carbon, ceramics or metals, are also suitable substrates.

Materials other than $YBa_2Cu_3O_x$ which might be deposited on the silver film by the method include other oxide superconductors, such as, $Bi_2Sr_2Ca_2Cu_3O_{10}$ and $Tl_2(Ca,Ba)_2CuO_6$, where one or more of the cations is supplied by the new approach of powder feeding utilized in this invention. Additionally, nonsuperconductors such as yttria ($Y_2O_3$), magnesia (MgO), barium titanate ($BaTiO_3$), ferrites and rare earth oxides, carbides, nitrides or borides can be deposited using the powder feeding process with low vapor pressure reagents.

Figure 13:
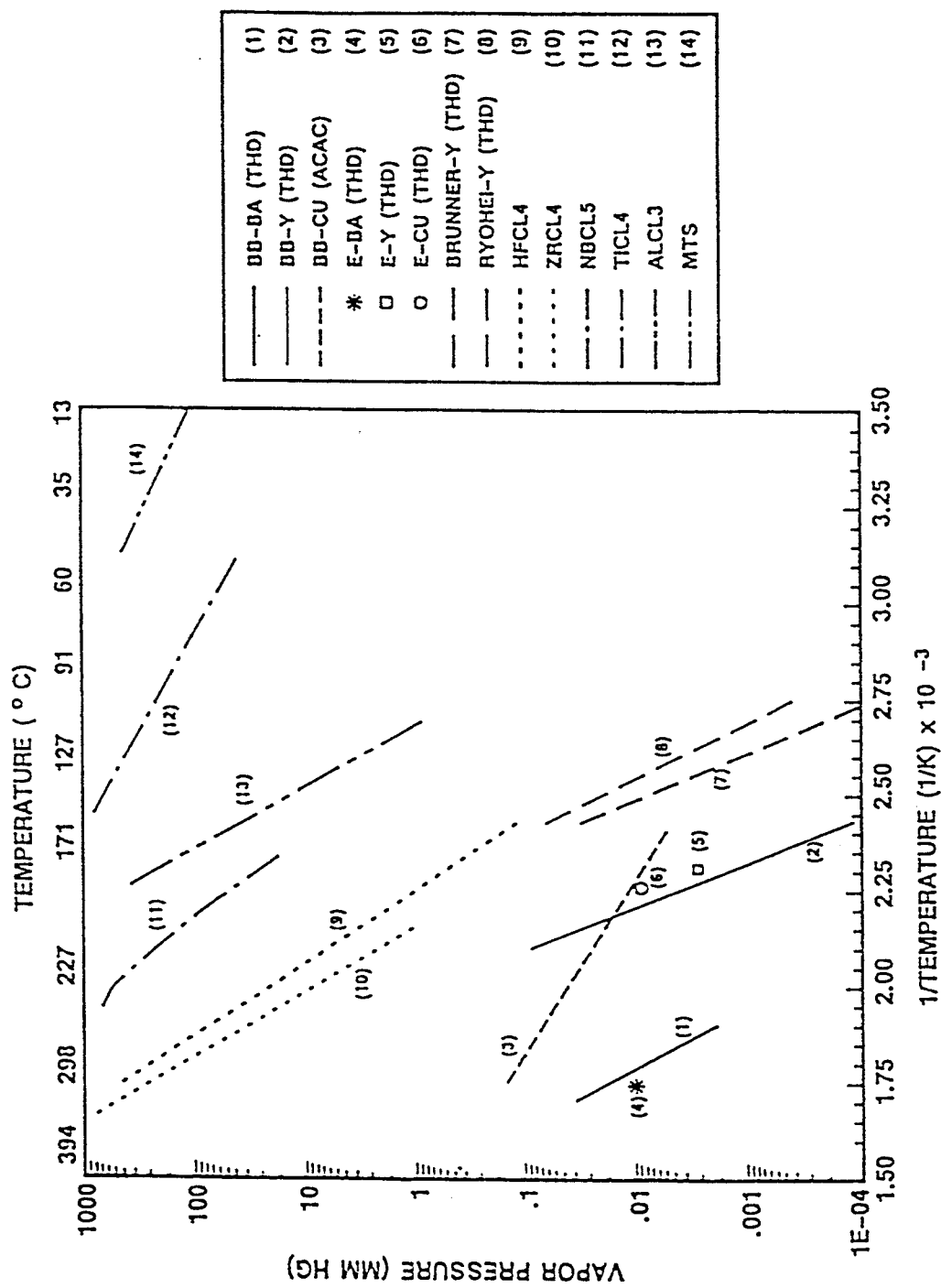
FIG. 13 is a graph showing the temperature versus vapor pressure for several reagents according to the prior art.

The vapor pressure data of FIG. 13 is a compilation of reagent vapor pressures for superconductors and other common reagents obtained from the literature. Vaporization cannot yield the high deposition rates for oxide superconductors, because oxide superconductor reagents have very low vapor pressures and cannot be practically (i.e., rapidly) introduced into a CVD furnace using vaporization techniques. Curves 1-8 are for yttrium, barium, and copper reagents used for the CVD of $YBa_2Cu_3O_x$ which are considered low vapor pressure reagents. Curves 9-14 are for other reagents which commonly are used for CVD of other materials which are considered high vapor pressure reagents. Two points are of interest; first, the vapor pressures of the yttrium, barium, and copper reagents are very low compared to the typical CVD reagents; second, the large discrepancy in vapor pressure of yttrium tetramethyl-hepatanedionate from the four literature sources (curves 2, 5, 7, and 8) is indicative of the difficulty in developing a controllable, repeatable CVD process which relies on sublimation of the beta-diketonates in vaporizers. The vapor pressure, and therefore flowrate of reagent from a vaporizer, varies with time and from lot-to-lot of reagent. The strong variation of vapor pressure with temperature, even for a given source, is evident from FIG. 13. This necessitates very close control of vaporizer temperature if a controllable flowrate of reagent is to be achieved. Three such vaporizers are involved in the conventional CVD of $YBa_2Cu_3O_x$.

Curves 10 and 11 in FIG. 13 are for $ZrCl_4$ and $NbCl_5$. These reagents have sufficiently high vapor pressures, e.g. 100 torr, within the temperature range over which they are stable and thus can be supplied by use of either vaporizers or by powder feeding. However, FIG. 13 shows that the vapor pressures of the yttrium, barium, and copper reagents (Curves 1-8) do not exceed about 0.1 torr. If these latter reagents are heated to higher temperatures than those shown in FIG. 13 in an attempt to obtain higher vapor pressures, these reagents decompose rapidly to form non-volatile compounds.

There is a distinct break in the graph of FIG. 13 occurring at a vapor pressure of about 0.1 Torr, with curves 1-8 having a vapor pressure of less than about 0.1 Torr and curves 9-14 having a vapor pressure of more than about 0.1 Torr. It is evident from FIG. 13 that those reagents having a vapor pressure of less than about 0.1 Torr are those reagents commonly known to those skilled in the art as "low vapor pressure" reagents.

Therefore, the term "low vapor pressure" when applied to reagents used in CVD generally applies to reagents having a vapor pressure at less than about 0.1 Torr. The reagents of curves 9-14, above about 0.1 Torr, are considered high vapor pressure reagents. Two other points about this process deserve mentioning at this juncture. First, although the low vapor pressure reagents are relatively unstable at certain conditions, the powder feeding allows for the deposition of these reagents despite this instability. Second, no heating supply is needed for the reagent supply system, allowing the reagent supply system to operate at ambient temperature, thus eliminating as unnecessary heating sources, lines and multiple vaporizers. Elimination of vaporizers avoids tile prior art problem of reagent decomposition, that is, aging.

2. Apparatus

FIG. 1 is a schematic for a vertical furnace arrangement, the mode which is the most useful in carrying out the process contemplated, although other arrangements can be used. FIG. 12 is a cutaway view of the vibratory powder feeder 12 used in the apparatus. The use of a powder feeder to introduce the silver reagent into the CVD furnace provides a faster, more reliable processing technique to deposit the silver film onto a substrate. Deposition rates of 2-10 microns per hour (33-167 nanometers per minute) have been routinely achieved; compared to deposition rates of 1-5.5 nanometers per hour as reported in prior plasma enhanced CVD art [C. Oehr & H. Suhr, 49 Appl. Phys. A 691-696 (1989)]. For example purposes only, the invention will be described below using the vertical furnace arrangement of FIG. 1 to achieve the deposition of a silver film onto several substrates, such as alumina or carbon tows. The deposition of silver films is accomplished in a low pressure, CVD reactor as shown in FIG. 1, which can be either hot walled or cold walled.

A modified vibratory feeder 12 such as a Syntron EB-051 is used to feed the silver reagent powder slowly into the CVD furnace. The modifications to the powder feeder 12 allow for a more uniform feed rate over the duration of the coating run. The silver reagent powder is pneumatically transported into the furnace using argon or hydrogen (99.999% purity) where it vaporizes and reacts. This results in deposition of the silver onto the substrate. Hydrogen is added to the inlet stream near the furnace. The flow rates for argon and hydrogen are controlled using MKS mass flow controllers 74. The temperature is monitored using an Inconel sheathed Type K thermocouple and/or an optical pyrometer. Typical deposition conditions are in the range summarized in Table I.

Immediately following deposition (without cooling), the system is backfilled with argon or hydrogen to atmospheric pressure, and the samples are cooled by turning off the furnace power. Coatings were deposited on both planar and fiber substrates. Planar substrates are single crystals of MgO, $SrTiO_3$, and stabilized $ZrO_2$, polycrystalline $Al_2O_3$, and stabilized $ZrO_2$. Fibers were Sumitomo, Nicalon, Nextel, Saphikon (single crystal $Al_2O_3$), and carbon.

TABLE I

|  | Range* | Preferred |
| --- | --- | --- |
| Total Pressure (atm) | $10^{-3}$–1 | .03–.05 |
| Deposition Temperature (°C.) | 250–800 | 300–500 |
| Argon Flowrate (l/min) | 0–5 | 4–5 |
| Hydrogen Flowrate (l/min) | 0–10 | 8–10 |

TABLE I-continued

|  | Range* | Preferred |
|---|---|---|
| Deposition Time (min) | 5 to 60 | 10–30 |
| Silver Reagent Mass (g) | 5–10 | 4–6 |

*The present invention is operative outside of this range

Argon, $H_2$, $N_2$, $H_e$, or any inert gas may be used as a carrier gas 16 and may be supplied from any conventional source such as refillable tanks 72. The flow rate of the carrier gas 16 is controlled by a conventional mass flow controller 74. The carrier gas 16 is introduced to the vibratory feeder 12 through input line 76. Input line 76 splits into two lines, an ambient line 78 and an carrier stream line 80. Ambient line 78 introduces the carrier gas 16 into the main vacuum cavity 82 of the vibratory feeder 12.

The vibratory powder feeder 12 is enclosed in a stainless steel chamber 14 to ensure a vacuum seal. Flowing carrier gas 16 is used as a pneumatic transport to assist in carrying the silver reagent powder 18, which is vibrated around a track 20 at a uniform rate inside the bowl 22, through the lines 24 and into the furnace 50. When the vibratory feeder 12 is in operation, the silver reagent powder 18 is vibrated around a track 20 inside the vibratory feeder bowl 22. The powder 18 is forced from the track 20 and is entrained in the carrier gas 16 flowing down the tube 30 located in the center of the bowl 22. The powder 18 entrained in the ambient carrier gas 16 merges with the carrier gas 16 contained in the carrier stream 28 forming a carrier gas-powder output stream 40 which is carried along output line 24 to the furnace 50. In addition to a vibratory feeder, the powder feeder can be any type of auger or other powder feeder type or pump in which powder can be fed uniformly into a CVD furnace.

The preferred rotary bowl powder feeder is a Syntron EB-051 parts feeder from FMC with several modifications, although rotary bowl powder feeders, including nonvibratory feeders, from other manufacturers can be used, if the appropriate modifications are made. These modifications include a tee 26 which has been attached at the exit lip of the bowl 22. The tee 26 causes the powder 18 to fall into carrier stream 28. Carrier gas 16 is also used to assist in carrying the powder 18 down through tube 30 into carrier stream 28. A second modification to the rotary bowl 22 is that two spots along the powder ramp have been restricted to about one sixteenth (1/16) of an inch. This modification allows the rotary bowl 22 to disperse powder at a more uniform rate. The powder 18 preferably is ground to below about 100 microns in diameter, although the exact diameter of the powder is not critical, prior to introduction to the vibratory feeder 12.

The substrate 52 to be coated is retained in a substrate holder 54 in the furnace 50. The furnace is heated to a temperature to between about 250 and about 800 which is held constant during the deposition process. The carrier gas-powder stream 40 enters the furnace 50 and is deposited on the substrate 52. When argon is used as the carrier gas 16, a stream of flowing hydrogen 17 also is brought to the inside of the furnace. The thickness of the coating deposited on the substrate is controlled by the temperature and pressure of the furnace and the amount of reagent introduced into the furnace 50. The powder feed rate as well as the duration of the run may be altered in order to vary the final coating thickness. The carrier gas-powder mixture 40 is introduced into the furnace 50 where the powder 18 vaporizes and subsequently reacts at the substrate material surface similar to other CVD processes.

Excess powder 18, decomposition products, carrier gas and hydrogen leave the furnace through exit line 58 and enter a scrubber 60. The exhaust gas is scrubbed to remove any acidic and condensable gases and particulates. The excess exhaust gases are pumped through pump 66 and exhausted into the atmosphere.

This process is repeatable, reliable, and provides a faster deposition rate compared to approaches which rely on transport of vapor from low vapor pressure and/or unstable reagents into the CVD furnace. Further, any product made using the CVD of superconducting coatings, including for example magnet development (coated fiber tows), and microelectronic applications (coated Si wafers), can be coated with a silver film first according to the present invention to improve the superconducting properties. Example products comprise wires, tapes, cables, motors, magnets, sensors, electromagnetic shields, antennae, RF cavities, switches, electronic components and other related devices.

3. Results

Typical results are presented in FIGS. 2–11. The results show successful deposition for several samples, including good repeatability. Profilometry, weight gain and scanning electron microscopy of fracture cross sections were used to determine coating thickness and therefore determine the deposition rate.

FIG. 2 is a micrograph showing a fiber tow uniformly coated with a silver film. FIG. 3 is an x-ray diffraction pattern of a $YBa_2Cu_3O_x$ film deposited on an alumina substrate coated first with a silver film. FIG. 4 are x-ray diffraction scans of $YBa_2Cu_3O_x$ films on polycrystalline alumina, as deposited and after annealing. FIG. 5 is the resistance versus temperature graph of $YBa_2Cu_3O_x$ deposited on a fiber tow coated with a silver film according to the present invention indicating superconductivity at 72K.

FIG. 6 is a micrograph of a cross-section of a silver film deposited from AgI, showing quality and uniformness. FIG. 7 is an AES survey of a sputtered-cleaned film produced from Ag(TFA) examined specifically for C, of which none is present. FIG. 8 are scanning electron microscope images showing the effect of increasing $H_2$ flow on deposition from AgI and Ag(TFA). A higher $H_2$ flow results in a higher quality film. FIG. 9 are micrographs showing the effect of temperature and pressure on the deposition of silver using Ag(PF). Lower pressures result in a higher quality film. FIG. 10 is a sample x-ray diffraction pattern developed from the study of FIG. 9. FIG. 11 is a scanning electron microscope image of a graphite tow coated with a silver film, showing uniform coating of irregular shapes is achieved.

The process has the distinct advantage of higher reagent introduction rates, and therefore higher coating rates, than the conventional approach in which the reagents are vaporized in individual external vaporizers prior to introduction into the CVD furnace.

4. Extensions

The use of silver barrier coatings deposited using chemical vapor deposition can be extended to other superconducting materials systems, including the Bi-Sr-Ca-Cu-O and Tl-Ca-Ba-Cu-O compounds and any other superconductor or nonsuperconductor material that would tend to react with the substrate if not first coated with silver. This technology extends the number of substrate materials on which the material can be deposited—substrates which previously had chemical interaction with the superconducting compound deposited. Most of the deposition of superconductors has been completed on single crystal oxide materials with a close lattice match to the compound. Use of the silver barrier layer extends the technology to otherwise reactive substrates. Also, the results indicate that a silver barrier layer can be applied to carbon fibers. The silver layer will protect the carbon fiber from oxidation during the subsequent deposition of $YBa_2Cu_3O_x$. This would permit use of inexpensive, small diameter carbon fibers as substrates.

Also, the silver coating could be applied after rather than before application of superconducting coating. In this application, the silver coating over the superconductor would: (1) facilitate soldering or otherwise connecting electrical leads; (2) serve as a protective layer to prevent moisture, $CO_2$ or other agents from degrading the superconductor; (3) increase the thermal conductivity of the composite to faciliate cooling; (4) provide a low electrical resistance path when the superconductor is not cooled below its critical temperature; and (5) provide mechanical rigidity particularly when the silver is deposited in such a manner that it infiltrates as well as overcoats a permeable structured such as fiber tow (bundle).

Finally, a silver layer can be applied both over the substrate and, after the superconductor has been applied over the silver layer, as a layer over the superconductor coating. This structure has the advantages of the barrier layer discussed throughout this Specification and the advantages discussed in the immediately preceeding paragraph.

The invention is not intended to be limited to the examples given above. It is obvious that those skilled in the art may make modifications to the method or the apparatus or both, without departing from the spirit or scope of the invention which is defined by the subjoined claims.

What is claimed is:

1. A method for applying a metal film barrier layer to a substrate using chemical vapor deposition comprising the steps of:
   (a) providing a substrate;
   (b) providing metal-bearing reagent particles, said metal being selected from the group consisting of Group IB and Group VIII metals;
   (c) providing a furnace means;
   (d) providing a powder feeder means for introducing said metal-bearing reagent particles into said furnace means;
   (e) placing said substrate within said furnace means;
   (f) introducing said metal-bearing reagent particles into said furnace means; and
   (g) reacting said metal-bearing reagent particles within said furnace means to deposit from the vapor phase the metal film barrier layer on said substrate.

2. The method for applying a metal film barrier layer to a substrate as described in claim 1, wherein said metal is selected from the group consisting of silver, gold, paladium, irridium and rhodium.

3. The method for applying a metal film barrier layer to a substrate as described in claim 1, wherein said substrate is selected from the group consisting of magnesium oxide, aluminum oxide, strontium titanate, zirconia, carbon, silica, combinations of aluminum oxide and silicon dioxide, and zirconium oxide.

4. The method for applying a metal film barrier layer to a substrate as described in claim 1, wherein said furnace means is a chemical vapor deposition reactor.

5. The method for applying a metal film barrier layer to a substrate as described in claim 1, further comprising depositing a coating of a material on said metal film barrier layer such that said material does not come in contact with said substrate.

6. The method for applying a metal film barrier layer to a substrate as described in claim 5, wherein said material is selected from the group consisting of $YBa_2Cu_3O_x$, $Sr_2CuO_6$, $Ca_2CuO_6$, $Bi_2Sr_2Ca_2Cu_3O_{10}$, $Tl_2(Ca,Ba)_2CuO_6$, $Bi_2CuO_6$, $Tl_2Ca_2CuO_6$, $Tl_2Ba_2CuO_6$, oxide superconductors containing Bi, St, Ca, Tl or rare earth metals, yttria, magnesia, barium titanate, rare earth oxides, carbides, nitrides, and borides.

7. The method for applying a metal film barrier layer to a substrate as described in claim 4, wherein said furnace is oriented in a horizontal position.

8. The method for applying a metal film barrier layer to a substrate as described in claim 4, wherein said furnace is oriented in a vertical position.

9. The method for applying a metal film barrier layer to a substrate as described in claim 1, wherein said metal-bearing reagent particles have a diameter of less than 100 microns.

10. The method for applying a metal film barrier layer to a substrate as described in claim 1, further comprising the step of entraining said metal-bearing reagent particles in a carrier gas which transports said metal-bearing reagent particles into said furnace means; wherein said entraining step occurs immediately prior to step (f).

11. The method for applying a metal film barrier layer to a substrate as described in claim 10, wherein said carrier gas is selected from the group consisting of inert gases, hydrogen, and nitrogen.

12. The method for applying a metal film barrier layer to a substrate as described in claim 8, wherein said substrate is selected from the group consisting of planar, fiber, tape, and cavity substrates.

13. The method for applying a metal film barrier layer to a substrate as described in claim 3, wherein said substrate is selected from the group consisting of single crystal materials, polycrystalline materials, planar materials, fibers, tapes, wires, cavities, and multi-filament tows.

14. The method for applying a metal film barrier layer to a substrate as described in claim 12, wherein said substrate is an electronic substrate.

* * * * *